United States Patent
Yun

(10) Patent No.: US 9,984,764 B2
(45) Date of Patent: May 29, 2018

(54) SEMICONDUCTOR MEMORY APPARATUS

(71) Applicant: SK hynix Inc., Icheon-si Gyeonggi-do (KR)

(72) Inventor: Dae Ho Yun, Seongnam-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days. days.

(21) Appl. No.: 15/478,700

(22) Filed: Apr. 4, 2017

(65) Prior Publication Data

US 2018/0108427 A1    Apr. 19, 2018

(30) Foreign Application Priority Data

Oct. 17, 2016 (KR) .................. 10-2016-0134102

(51) Int. Cl.
*G11C 7/10* (2006.01)
*G11C 29/02* (2006.01)
*G11C 7/22* (2006.01)
*G11C 8/10* (2006.01)

(52) U.S. Cl.
CPC .............. *G11C 29/023* (2013.01); *G11C 7/22* (2013.01); *G11C 8/10* (2013.01)

(58) Field of Classification Search
CPC ............ G11C 29/023; G11C 7/22; G11C 8/10
USPC ........................................ 365/189.02, 230.03
See application file for complete search history.

(56) References Cited

U.S. PATENT DOCUMENTS

2014/0133247 A1*  5/2014  Ku .................. G11C 29/40
                                              365/189.05

FOREIGN PATENT DOCUMENTS

KR          100190853 B1    1/1999
KR       1020040050529 A    6/2004

* cited by examiner

*Primary Examiner* — Huan Hoang
(74) *Attorney, Agent, or Firm* — William Park & Associates Ltd.

(57) ABSTRACT

A semiconductor memory apparatus may include a control circuit, a decoding circuit, and a memory circuit. The control circuit may output one of bank group signals as either a first bank group distribution signal or a second bank group distribution signal and output one of data designation addresses as either a first data designation distribution address or a second data designation distribution address, in response to a first test signal and a second test signal. The decoding circuit may generate decoding signals depending on remaining bank group signals, remaining data designation addresses, bank designation signals, the first and second bank group distribution signals, and the first and second data designation distribution addresses. The memory may select certain memory location to output or store data, in response to the decoding signals.

12 Claims, 4 Drawing Sheets

SEMICONDUCTOR MEMORY APPARATUS

CROSS-REFERENCES TO RELATED APPLICATION

The present application claims priority under 35 U.S.C. § 119(a) to Korean application number 10-2016-0134102 filed on Oct. 17, 2016, in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

A semiconductor memory apparatus is an integrated circuit that is used to store data. The basic operation performed to store data in the semiconductor memory apparatus is called a "write" operation. The data in the semiconductor memory apparatus can be accessed by means of a "read" operation.

The read and write operations of the semiconductor memory apparatus may be performed in response to command and address signals applied from an external device such as a memory controller. In particular, the semiconductor memory apparatus may select between the read and write operations in response to the command signal, and may determine a proper memory location to store data therein or output data therefrom in response to the address signal.

The semiconductor memory apparatus may be tested to determine whether it meets design specifications. For example, the semiconductor memory apparatus may be tested to determine whether it performs the write and read operations properly in response to the command and address signals.

SUMMARY

In an embodiment, a semiconductor memory apparatus may include a control circuit, a decoding circuit, and a memory circuit. The control circuit may output one bank group signal selected out of a plurality of bank group signals as either a first bank group distribution signal or a second bank group distribution signal, and may output one data designation address selected out of a plurality of data designation addresses as either a first data designation distribution address or a second data designation distribution address, in response to a first test signal and a second test signal. The decoding circuit may generate decoding signals based on remaining bank group signals, remaining data designation addresses, bank designation signals, the first bank group distribution signal and the second bank group distribution signal, and the first data designation distribution address and the second data designation distribution address. The memory circuit may select a certain memory location to output or store data, in response to the decoding signals.

In an embodiment, a semiconductor memory apparatus may include a memory circuit, a control circuit, and a decoding circuit. The memory circuit may include a plurality of bank groups each including a plurality of banks. The control circuit may generate a first bank group distribution signal and a second bank group distribution signal in response to a test signal and one bank group signal selected out of a plurality of bank group signals. The decoding circuit may generate decoding signals in response to remaining bank group signals, the first bank group distribution signal and the second bank group distribution signal. One or two of the plurality of bank groups may be selected in response to the decoding signal.

In an embodiment, a semiconductor memory apparatus may include a memory circuit, a control circuit, and a decoding circuit. The memory circuit may include a plurality of bank groups each including a plurality of banks. The control circuit may receive a test signal and a bank group signal and determine whether the semiconductor memory apparatus is in a test mode or not. The decoding circuit may select a plurality of banks at the same time when the semiconductor memory apparatus is in a test mode.

DETAILED DESCRIPTION

Hereinafter, a semiconductor memory apparatus will be described below with reference to the accompanying drawings through various examples of embodiments.

Figure 1:
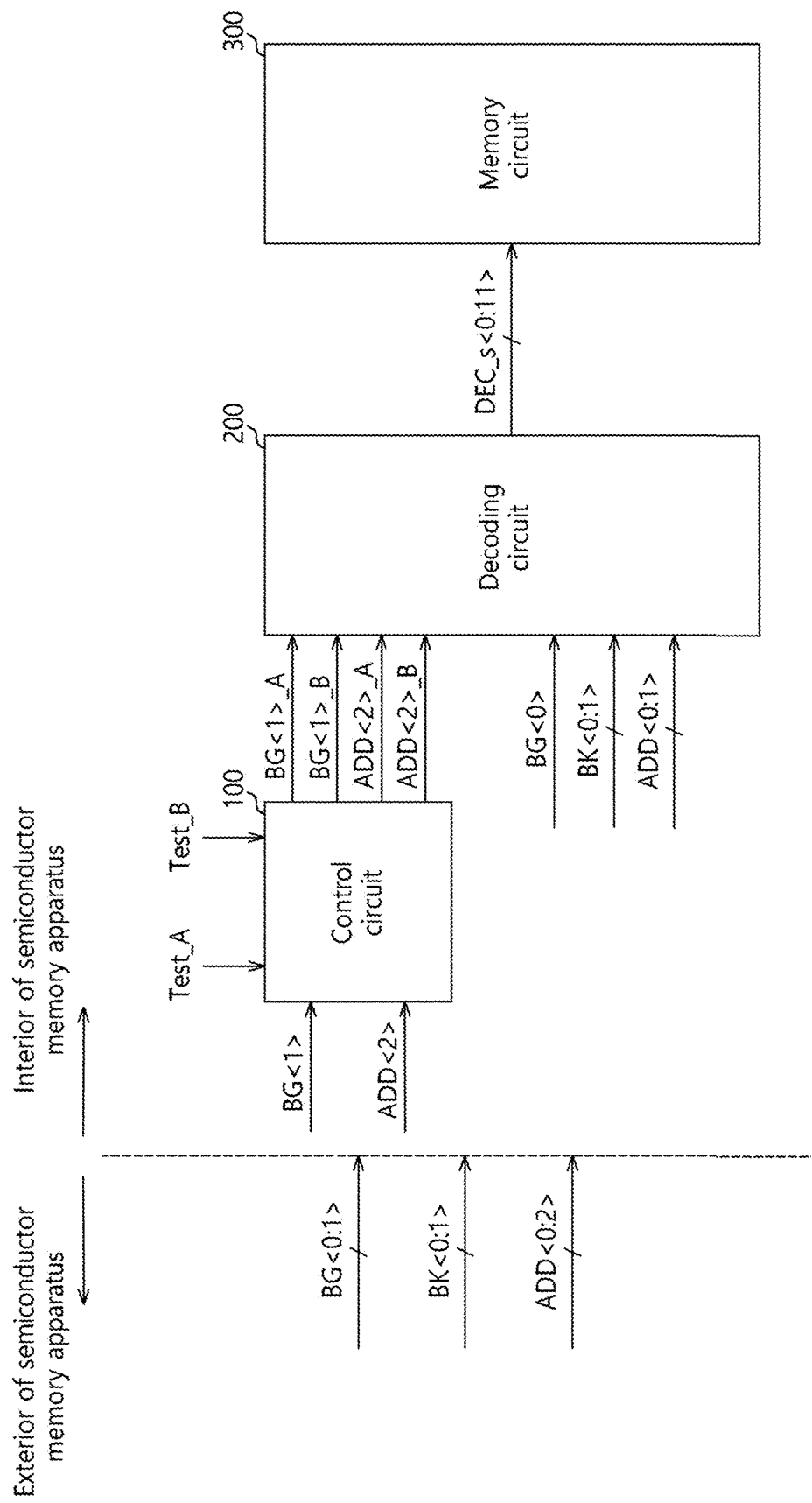
FIG. 1 is a configuration diagram illustrating an example of a semiconductor memory apparatus in accordance with an embodiment.
Figure 2:
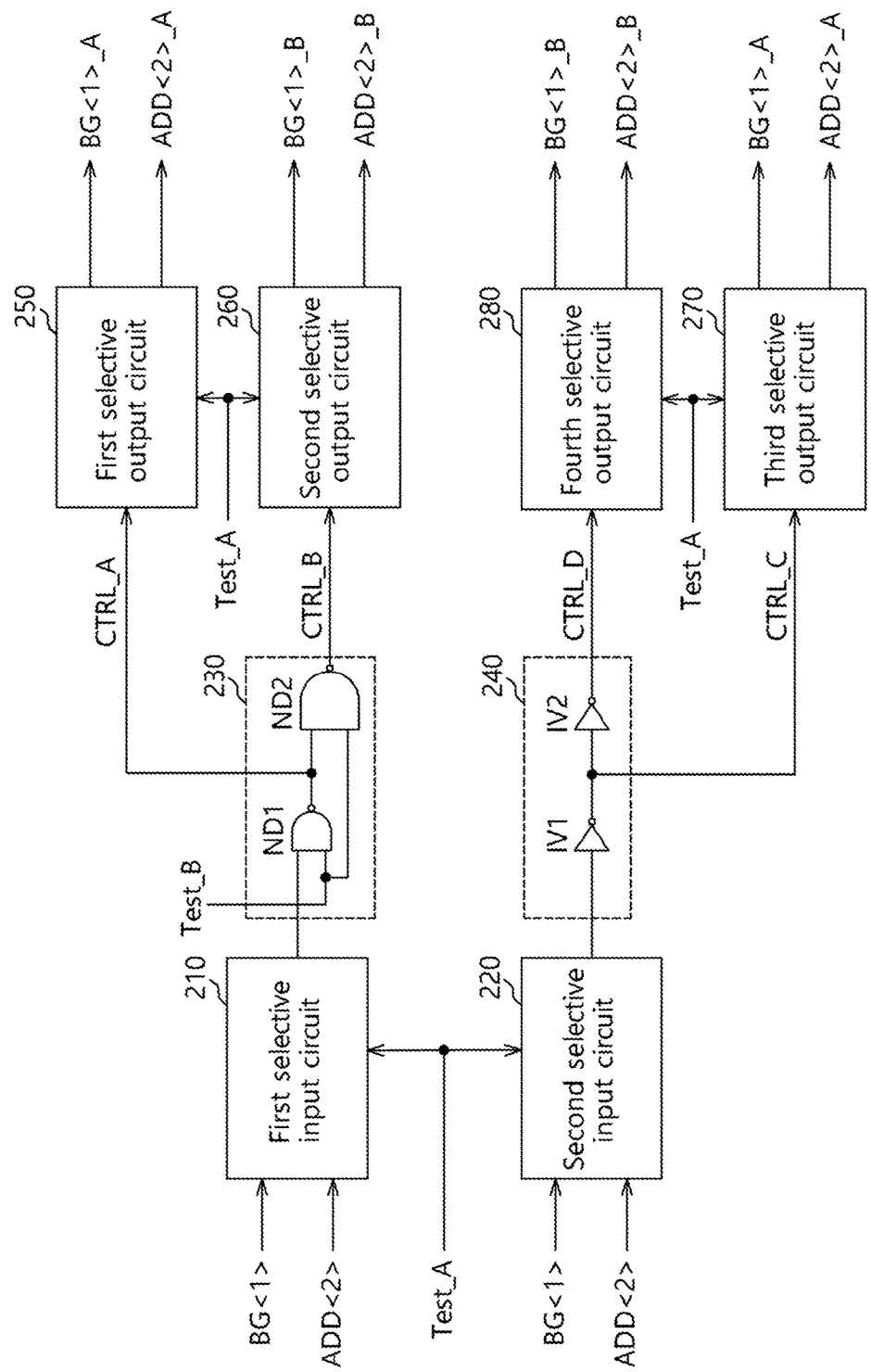
FIG. 2 is a configuration diagram illustrating an example of the control circuit shown in FIG. 1.

In FIG. 1, a semiconductor memory apparatus in accordance with an embodiment may include a control circuit 100, a decoding circuit 200, and a memory circuit 300.

The semiconductor memory apparatus may receive a command, an address, and data from an external device. During a write operation, the semiconductor memory apparatus may store data in a certain memory location assigned to a certain address, and may output the data stored in the certain memory location in response to the certain address.

FIG. 1 illustrates how the semiconductor memory apparatus receives an address and decodes it. The address may include a first bank group signal BG<0>, a second bank group signal BG<1>, a first bank designation signal BK<0>, a second bank designation signal BK<1>, a first data designation address ADD<0>, a second data designation address ADD<1>, and a third data designation address ADD<2>.

The control circuit 100 may output the second bank group signal BG<1> as either a first bank group distribution signal BG<1>_A or a second bank group distribution signal BG<1>_B in response to a first test signal Test_A and a second test signal Test_B. The control circuit 100 may also output the third data designation address ADD<2> as either a first data designation distribution address ADD<2>_A or a second data designation distribution address ADD<2>_B in response to a first test signal Test_A and a second test signal Test_B. For example, when both the first and second test signals Test_A and Test_B are disabled, the control circuit 100 may output the first and second bank group distribution signals BG<1>_A and BG<1>_B at different logic levels and the first and second data designation distribution addresses ADD<2>_A and ADD<2>_B at different logic levels, in response to the second bank group signal BG<1> and the third data designation address ADD<2>. When one of the first and second test signals Test_A and Test_B is enabled, the control circuit 100 may output the first and second bank group distribution signals BG<1>_A and BG<1>_B at different logic levels in response to the second bank group signal BG<1>, and may output the first and second data designation distribution addresses ADD<2>_A and ADD<2>_B at the same logic level as each other regardless of the third data designation address ADD<2>. Also, when the other of the first and second test signals Test_A and Test_B is enabled, the control circuit 100 may output the first and second bank group distribution signals BG<1>_A and BG<1>_B at the same logic level as each other regardless of the second bank group signal BG<1>, and may output the first and second data designation distribution addresses ADD<2>_A and ADD<2>_B at different logic levels in response to the third data designation address ADD<2>.

The decoding circuit 200 may generate first to twelfth decoding signals DEC_s<0:11> in response to the first and second bank group distribution signals BG<1>_A and BG<1>_B, the first and second data designation distribution addresses ADD<2>_A and ADD<2>_B, the first bank group signal BG<0>, the first and second bank designation signals BK<0:1> and the first and second data designation addresses ADD<0> and ADD<1>. For example, the decoding circuit 200 may enable one of the first to twelfth decoding signals DEC_s<0:11> by decoding the first and second bank group distribution signals BG<1>_A and BG<1>_B at different logic levels, the first and second data designation distribution addresses ADD<2>_A and ADD<2>_B at different logic levels, the first bank group signal BG<0>, the first and second bank designation signals BK<0:1>, and the first and second data designation addresses ADD<0> and ADD<1>. The decoding circuit 200 may enable two decoding signals selected between the first to twelfth decoding signals DEC_s<0:11> by decoding the first and second bank group distribution signals BG<1>_A and BG<1>_B at the same logic level, the first and second data designation distribution addresses ADD<2>_A and ADD<2>_B at different logic levels, the first bank group signal BG<0>, the first and second bank designation signals BK<0:1>, and the first and second data designation addresses ADD<0> and ADD<1>. The decoding circuit 200 may enable two decoding signals selected between the first to twelfth decoding signals DEC_s<0:11> by decoding the first and second bank group distribution signals BG<1>_A and BG<1>_B at different logic levels, the first and second data designation distribution addresses ADD<2>_A and ADD<2>_B at the same logic level as each other, the first bank group signal BG<0>, the first and second bank designation signals BK<0:1>, and the first and second data designation addresses ADD<0> and ADD<1>.

The memory circuit 300 may determine a memory location in which data is to be stored or a memory location from which data to be output, in response to the first to twelfth decoding signals DEC_s<0:11>.

The control circuit 100 may include a first selective input circuit 210, a second selective input circuit 220, a first signal distribution circuit 230, a second signal distribution circuit 240, a first selective output circuit 250, a second selective output circuit 260, a third selective output circuit 270, and a fourth selective output circuit 280.

The first selective input circuit 210 may output one of the second bank group signal BG<1> and the third data designation address ADD<2>, as an output signal, in response to the first test signal Test_A. For example, the first selective input circuit 210 may output the second bank group signal BG<1> selected between the second bank group signal BG<1> and the third data designation address ADD<2>, as the output signal, when the first test signal Test_A is enabled. The first selective input circuit 210 may output the third data designation address ADD<2> selected between the second bank group signal BG<1> and the third data designation address ADD<2>, as the output signal, when the first test signal Test_A is disabled.

The second selective input circuit 220 may output one of the second bank group signal BG<1> and the third data designation address ADD<2>, as an output signal, in response to the first test signal Test_A. For example, the second selective input circuit 220 may output the third data designation address ADD<2> selected between the second bank group signal BG<1> and the third data designation address ADD<2>, as the output signal, when the first test signal Test_A is enabled. The second selective input circuit 220 may output the second bank group signal BG<1> selected between the second bank group signal BG<1> and the third data designation address ADD<2>, as the output signal, when the first test signal Test_A is disabled.

Each of the first and second selective input circuits 210 and 220 may output one of the second bank group signal BG<1> and the third data designation address ADD<2> in response to the first test signal Test_A. The first and second selective input circuits 210 and 220 may include multiplexers.

The first signal distribution circuit 230 may generate first and second control signals CTRL_A and CTRL_B at different logic levels or at the same logic level as each other in response to the second test signal Test_B and the output signal of the first selective input circuit 210. For example, the first signal distribution circuit 230 may generate the first and second control signals CTRL_A and CTRL_B at different logic levels in response to the output signal of the first selective input circuit 210 when the second test signal Test_B is disabled. The first signal distribution circuit 230 may generate the first and second control signals CTRL_A and CTRL_B at the same logic level as each other regardless of the output signal of the first selective input circuit 210 when the second test signal Test_B is enabled.

The first signal distribution circuit 230 may include first and second NAND gates ND1 and ND2. The first NAND gate ND1 is input with the output signal of the first selective input circuit 210 and the second test signal Test_B, and may output the first control signal CTRL_A. The second NAND gate ND2 is input with the output signal of the first NAND gate ND1 and the second test signal Test_B, and may output the second control signal CTRL_B.

The second signal distribution circuit 240 may generate third and fourth control signals CTRL_C and CTRL_D at different logic levels in response to the output signal of the second selective input circuit 220.

The second signal distribution circuit 240 may include first and second inverters IV1 and IV2. The first inverter IV1 may be input with the output signal of the second selective input circuit 220, and may output the third control signal CTRL_C. The second inverter IV2 may be input with the output signal of the first inverter IV1, and may output the fourth control signal CTRL_D.

The first selective output circuit 250 may output the first control signal CTRL_A as one of the first bank group distribution signal BG<1>_A and the first data designation distribution address ADD<2>_A in response to the first test signal Test_A. For example, the first selective output circuit 250 may output the first control signal CTRL_A as the first bank group distribution signal BG<1>_A when the first test signal Test_A is enabled, and may output the first control signal CTRL_A as the first data designation distribution address ADD<2>_A when the first test signal Test_A is disabled.

The second selective output circuit 260 may output the second control signal CTRL_B as one of the second bank group distribution signal BG<1>_B and the second data designation distribution address ADD<2>_B in response to the first test signal Test_A. For example, the second selective output circuit 260 may output the second control signal CTRL_B as the second bank group distribution signal BG<1>_B when the first test signal Test_A is enabled, and may output the second control signal CTRL_B as the second data designation distribution address ADD<2>_B when the first test signal Test_A is disabled.

The third selective output circuit 270 may output the third control signal CTRL_C as one of the first bank group distribution signal BG<1>_A and the first data designation distribution address ADD<2>_A in response to the first test signal Test_A. For example, the third selective output circuit 270 may output the third control signal CTRL_C as the first data designation distribution address ADD<2>_A when the first test signal Test_A is enabled, and may output the third control signal CTRL_C as the first bank group distribution signal BG<1>_A when the first test signal Test_A is disabled.

The fourth selective output circuit 280 may output the fourth control signal CTRL_D as one of the second bank group distribution signal BG<1>_B and the second data designation distribution address ADD<2>_B in response to the first test signal Test_A. For example, the fourth selective output circuit 280 may output the fourth control signal CTRL_D as the second data designation distribution address ADD<2>_B when the first test signal Test_A is enabled, and may output the fourth control signal CTRL_D as the second bank group distribution signal BG<1>_B when the first test signal Test_A is disabled.

Each of the first to fourth selective output circuits 250 to 280 may include a demultiplexer.

The operation of the semiconductor memory apparatus in accordance with an embodiment will be described below with reference to FIG. 3A to 3C.

The semiconductor memory apparatus in accordance with an embodiment illustrated in FIG. 1 includes the memory circuit 300. The memory circuit 300 may include first to fourth bank groups BG0, BG1, BG2, and BG3, and each bank group may include first to fourth banks BK0, BK1, BK2, and BK3. For example, a single semiconductor memory chip may have multiple banks, and these banks may be grouped into bank groups.

When both the first and second test signals Test_A and Test_B are disabled, the control circuit 100 shown in FIG. 1 may generate the first and second bank group distribution signals BG<1>_A and BG<1>_B at different logic levels and the first and second data designation distribution addresses ADD<2>_A and ADD<2>_B at different logic levels, in response to the second bank group signal BG<1> and the third data designation address ADD<2>.

The decoding circuit 200 may enable one of the first to twelfth decoding signals DEC_s<0:11> by decoding the first bank group distribution signal BG<1>_A and the second bank group distribution signal BG<1>_B at different logic levels, the first data designation distribution address ADD<2>_A and the second data designation distribution address ADD<2>_B at different logic levels, the first bank group signal BG<0>, the first bank designation signal BK<0> and the second bank designation signal BK<1>, and the first data designation address ADD<0> and the second data designation address ADD<1>.

Figure 3A:
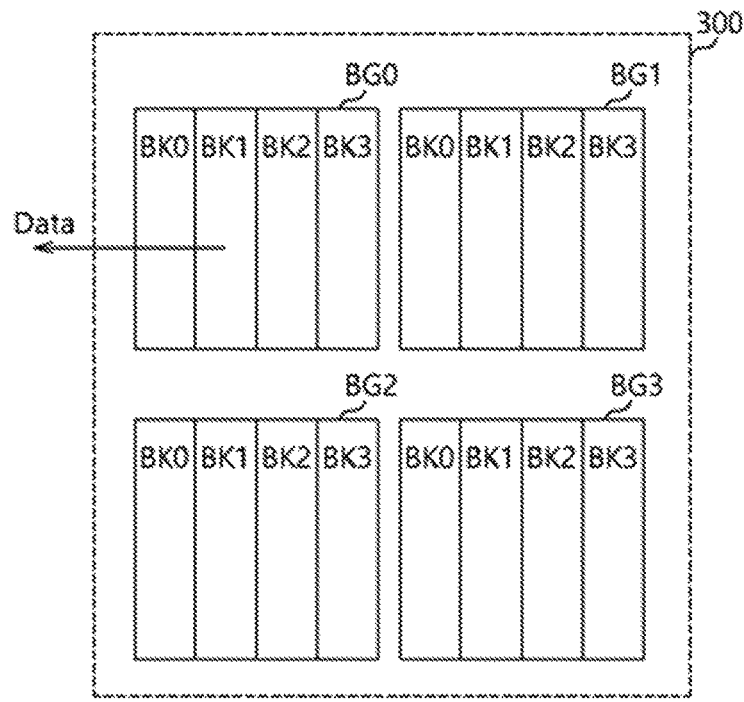
FIG. 3A to 3C are diagrams provided to assist in the explanation of the operation of the semiconductor memory apparatus in accordance with the embodiment.

As illustrated in FIG. 3A, the decoding circuit 200 may select one bank group out of the four bank groups and select one bank out of the banks included in the selected bank group by enabling one decoding signal out of the first to twelfth decoding signals DEC_s<0:11>. When both the first and second test signals Test_A and Test_B are disabled, the decoding circuit 200 may select one bank by enabling one of the first to twelfth decoding signals DEC_s<0:11>. For example, when the semiconductor memory apparatus is not in a test mode, the decoding circuit 200 may select banks on a bank-by-bank basis. While it is illustrated that data is output from the selected bank, it is possible to write data into the selected bank.

When the first test signal Test_A is disabled and the second test signal Test_B is enabled, the control circuit 100 illustrated in FIG. 1 generates the first and second bank group distribution signals BG<1>_A and BG<1>_B at different logic levels in response to the second bank group signal BG<1>, and generates the first and second data designation distribution addresses ADD<2>_A and ADD<2>_B at the same logic level as each other regardless of the third data designation address ADD<2>.

The decoding circuit 200 may enable two decoding signals selected between the first to twelfth decoding signals DEC_s<0:11> by decoding the first bank group distribution signal BG<1>_A and the second bank group distribution signal BG<1>_B at different logic levels, the first data designation distribution address ADD<2>_A and the second data designation distribution address ADD<2>_B at the same logic level, the first bank group signal BG<0>, the first bank designation signal BK<0> and the second bank designation signal BK<1>, and the first data designation address ADD<0> and the second data designation address ADD<1>.

Figure 3B:
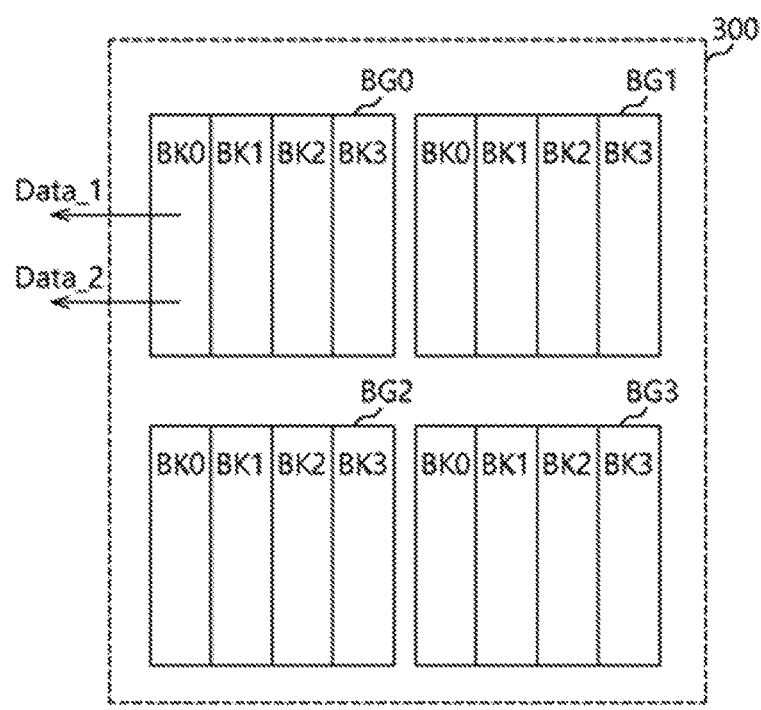

As illustrated in FIG. 3B, the decoding circuit 200 may select one bank by enabling two decoding signals that are assigned to the same bank, out of the first to twelfth decoding signals DEC_s<0:11>. Two data signals are output from the one designated bank. While it is illustrated that data signals are output from the selected bank, it is possible to write data into the selected bank.

When both the first and second test signals Test_A and Test_B are enabled, the control circuit 100 illustrated in FIG. 1 generates the first and second bank group distribution signals BG<1>_A and BG<1>_B at the same logic level as each other regardless of the second bank group signal BG<1>, and generates the first and second data designation distribution addresses ADD<2>_A and ADD<2>_B at different logic levels in response to the third data designation address ADD<2>.

The decoding circuit 200 may enable two decoding signals selected between the first to twelfth decoding signals DEC_s<0:11> by decoding the first bank group distribution signal BG<1>_A and the second bank group distribution signal BG<1>_B at the same logic level, the first data designation distribution address ADD<2>_A and the second data designation distribution address ADD<2>_B at different logic levels, the first bank group signal BG<0>, the first bank designation signal BK<0> and the second bank designation signal BK<1>, and the first data designation address ADD<0> and the second data designation address ADD<1>.

Figure 3C:
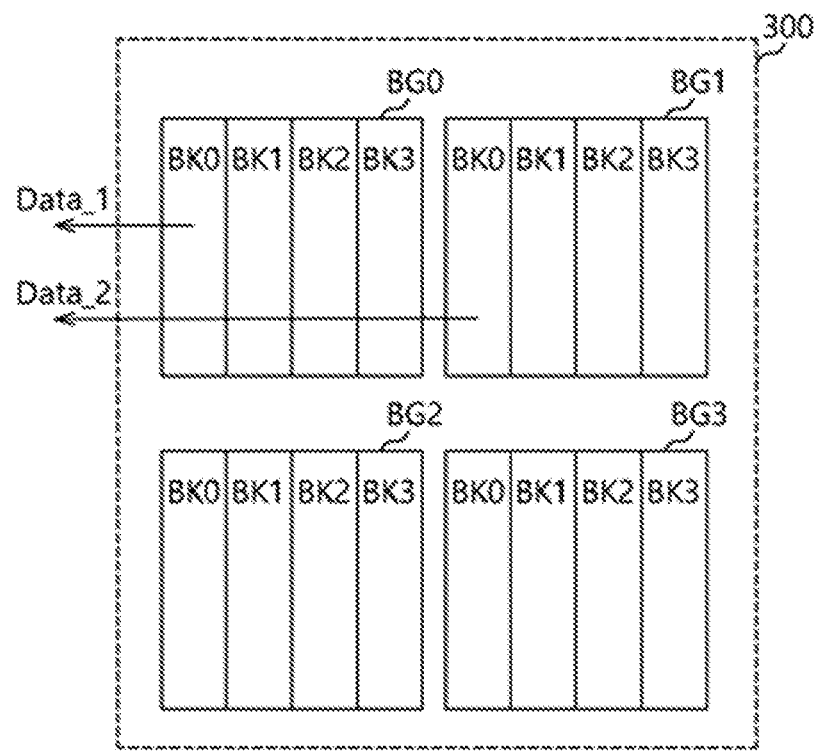

As illustrated in FIG. 3C, the decoding circuit 200 may select two banks from different bank groups by enabling two decoding signals selected between the first to twelfth decoding signals DEC_s<0:11>. When both the first and second test signals Test_A and Test_B are enabled, the decoding circuit 200 may select two bank groups, and select the first bank from one bank and the second bank from the other bank. For example, when the semiconductor memory apparatus is in a test mode, the decoding circuit 200 may select a plurality of banks at the same time. While it is illustrated that data signals are output from the selected banks, it is possible to write data into the selected bank.

As is apparent from the above descriptions, the semiconductor memory apparatus in accordance with an embodiment may output or store one data signals or a plurality of data signals from or in a memory circuit by using a plurality of test signals. Also, in the case where a plurality of data are to be output or stored, the semiconductor memory apparatus in accordance with an embodiment may output the plurality of data signals from the same bank group or output one data signal from each of different bank groups.

While various embodiments have been described above, it will be understood to those skilled in the art that the embodiments described are examples only. Accordingly, the semiconductor memory apparatus described herein should not be limited based on the described embodiments.

What is claimed is:

1. A semiconductor memory apparatus comprising:
   a control circuit suitable for generating a first bank group distribution signal and a second bank group distribution signal based on one bank group signal selected out of a plurality of bank group signals and generating a first data designation distribution address and a second data designation distribution address based on one data designation address selected out of a plurality of data designation addresses, in response to a first test signal and a second test signal;
   a decoding circuit suitable for generating decoding signals based on remaining bank group signals, remaining data designation addresses, bank designation signals, the first bank group distribution signal and the second bank group distribution signal, and the first data designation distribution address and the second data designation distribution address; and
   a memory circuit suitable for selecting a certain memory location to output or store data, in response to the decoding signals.

2. The semiconductor memory apparatus according to claim 1, wherein, in response to the first test signal and the second test signal, the control circuit generates the first and second bank group distribution signals at different logic levels and the first and second data designation distribution addresses at different logic levels, generates the first and second bank group distribution signals at different logic levels and the first and second data designation distribution addresses at the same logic level, or generates the first and second bank group distribution signals at the same logic level and the first and second data designation distribution addresses at different logic levels.

3. The semiconductor memory apparatus according to claim 2, wherein, when both the first test signal and the second test signal are enabled, the control circuit generates the first and second bank group distribution signals at the same logic level regardless of the selected bank group signal, and generates the first and second data designation distribution addresses at different logic levels in response to the selected data designation address.

4. The semiconductor memory apparatus according to claim 3, wherein, when the first test signal is disabled and the second test signal is enabled, the control circuit generates the first and second bank group distribution signals at different logic levels in response to the selected bank group signal, and generates the first and second data designation distribution addresses at the same logic level regardless of the selected data designation address.

5. The semiconductor memory apparatus according to claim 4, wherein the control circuit comprises:
   a first selective input circuit suitable for outputting one of the selected bank group signal and the selected data designation address, as an output signal, in response to the first test signal;
   a second selective input circuit suitable for outputting one of the selected bank group signal and the selected data designation address, as an output signal, in response to the first test signal;
   a first signal distribution circuit suitable for generating a first control signal and a second control signal at different logic levels or at the same logic level depending on the output signal of the first selective input circuit in response to the second test signal;
   a second signal distribution circuit suitable for generating a third control signal and a fourth control signal at different logic levels in response to the output signal of the second selective input circuit;
   a first selective output circuit suitable for outputting the first control signal as the first bank group distribution signal or the first data designation distribution address in response to the first test signal;
   a second selective output circuit suitable for outputting the second control signal as the second bank group distribution signal or the second data designation distribution address in response to the first test signal;
   a third selective output circuit suitable for outputting the third control signal as the first bank group distribution signal or the first data designation distribution address in response to the first test signal; and
   a fourth selective output circuit suitable for outputting the fourth control signal as the second bank group distribution signal or the second data designation distribution address in response to the first test signal.

6. The semiconductor memory apparatus according to claim 5, wherein each of the first and second selective input circuits comprises a multiplexer.

7. The semiconductor memory apparatus according to claim 5, wherein each of the first to fourth selective output circuits comprises a demultiplexer.

8. The semiconductor memory apparatus according to claim 1, wherein the memory circuit comprises a plurality of bank groups, and each bank group comprises a plurality of banks.

9. A semiconductor memory apparatus comprising:
   a memory circuit including a plurality of bank groups each including a plurality of banks;
   a control circuit suitable for generating a first bank group distribution signal and a second bank group distribution signal in response to a test signal and one bank group signal selected out of a plurality of bank group signals; and
   a decoding circuit suitable for generating decoding signals in response to remaining bank group signals, the first bank group distribution signal and the second bank group distribution signal,
   wherein one or two of the plurality of bank groups are selected in response to the decoding signal.

10. The semiconductor memory apparatus according to claim 9, wherein the control circuit generates the first and second bank group distribution signals at the same logic level when the test signal is enabled, and generates the first and second bank group distribution signals at different logic levels in response to the selected bank group signal when the test signal is disabled.

11. The semiconductor memory apparatus according to claim 10, wherein the decoding circuit enables one of the decoding signals when the remaining bank group signals and the first and second bank group distribution signals are at different logic levels, and enables two of the decoding signals when the remaining bank group signals and the first and second bank group distribution signals are at the same logic level.

12. The semiconductor memory apparatus according to claim 11, wherein the memory circuit selects one of the plurality of bank groups when one of the decoding signals is enabled, and selects two of the plurality of bank groups when two of the decoding signals are enabled.

* * * * *